(12) United States Patent
Hartouniyan et al.

(10) Patent No.: US 11,762,435 B2
(45) Date of Patent: Sep. 19, 2023

(54) ELECTRONIC DEVICE AND CASING

(71) Applicant: COOLER MASTER (SHANGHAI) TECHNOLOGY CO., LTD., Shanghai (CN)

(72) Inventors: Levik Hartouniyan, Shanghai (CN); Yuqing Lyu, Shanghai (CN); Lei Wang, Shanghai (CN); Xiao wei Li, Shanghai (CN)

(73) Assignee: COOLER MASTER (SHANGHAI) TECHNOLOGY CO., LTD., Shanghai (CN)

( * ) Notice: Subject to any disclaimer, the term of this patent is extended or adjusted under 35 U.S.C. 154(b) by 36 days.

(21) Appl. No.: 17/574,991

(22) Filed: Jan. 13, 2022

(65) Prior Publication Data
US 2023/0071666 A1 Mar. 9, 2023

(30) Foreign Application Priority Data
Sep. 9, 2021 (CN) .......................... 202111056779.5

(51) Int. Cl.
*G06F 1/16* (2006.01)
*G06F 1/18* (2006.01)
*H05K 5/02* (2006.01)

(52) U.S. Cl.
CPC ........... *G06F 1/181* (2013.01); *H05K 5/0226* (2013.01); *H05K 5/0286* (2013.01)

(58) Field of Classification Search
CPC ..... G06F 1/181; H05K 5/0226; H05K 5/0286
See application file for complete search history.

(56) References Cited

U.S. PATENT DOCUMENTS

| | | | |
|---|---|---|---|
| 9,110,640 B2 * | 8/2015 | Lin | G06F 1/185 |
| 9,629,291 B1 * | 4/2017 | Chen | G06F 1/186 |
| 10,383,249 B1 * | 8/2019 | Peng | H05K 7/1489 |
| 10,423,198 B1 * | 9/2019 | Tsai | H05K 7/1487 |
| 11,096,306 B1 * | 8/2021 | Xu | G06F 1/185 |
| 11,314,292 B2 * | 4/2022 | Christensen | G11B 23/0322 |
| 2011/0255234 A1 * | 10/2011 | Chen | G06F 1/187 |
| | | | 361/679.32 |
| 2020/0375054 A1 * | 11/2020 | Pham | H05K 7/18 |

* cited by examiner

Primary Examiner — Rockshana D Chowdhury
(74) Attorney, Agent, or Firm — Maschoff Brennan

(57) ABSTRACT

An electronic device includes a casing and an expansion card. The casing includes a chassis and an installation frame. The installation frame is pivotably disposed on the chassis. The expansion card is fixed to the installation frame. The expansion card is movable along with the installation frame so as to be located in the chassis or at least partially located outside the chassis.

15 Claims, 5 Drawing Sheets

ELECTRONIC DEVICE AND CASING

CROSS-REFERENCE TO RELATED APPLICATIONS

This non-provisional application claims priority under 35 U.S.C. § 119(a) on Patent Application No(s). 202111056779.5 filed in China on Sep. 9, 2021, the entire contents of which are hereby incorporated by reference.

TECHNICAL FIELD

The disclosure relates to an electronic device and a casing, more particularly to an electronic device and a casing having a pivotable installation frame.

BACKGROUND

Generally, in a computer, there are a motherboard, a graphics card, a sound card, a network card, hard disk drives, an optical disk drive, a power supply and so on installed inside a computer casing. Due to the large number of these components, the space not occupied by these components in the casing is narrow, such that it is troublesome and difficult to maintain these electronic components. Therefore, how to reduce the difficulty of maintaining these electronic components are one of the crucial topics in this field.

SUMMARY

The disclosure provides an electronic device and a casing which are capable of allowing a user to maintain the electronic components therein easily.

One embodiment of the disclosure provides an electronic device. The electronic device includes a casing and an expansion card. The casing includes a chassis and an installation frame. The installation frame is pivotably disposed on the chassis. The expansion card is fixed to the installation frame.

Still another embodiment of the disclosure provides a casing configured for an installation of an expansion card. The casing includes a chassis and an installation frame. The installation frame is pivotably disposed on the chassis and configured for the installation of the expansion card.

According to the electronic device and the casing as described in the above embodiment, the expansion card is disposed on the installation frame which is pivotable relative to the chassis, such that when the expansion card is required to be removed from the casing, or components in the chassis are required to be maintained, the expansion card can be moved out of the accommodation space of the chassis by pivoting the installation frame. By doing so, there is sufficient room for a user to easily remove the expansion card from the installation frame or maintain the components in the chassis easily without the interference of the expansion card. Therefore, it is convenient to maintain the components inside the casing or the electronic device.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
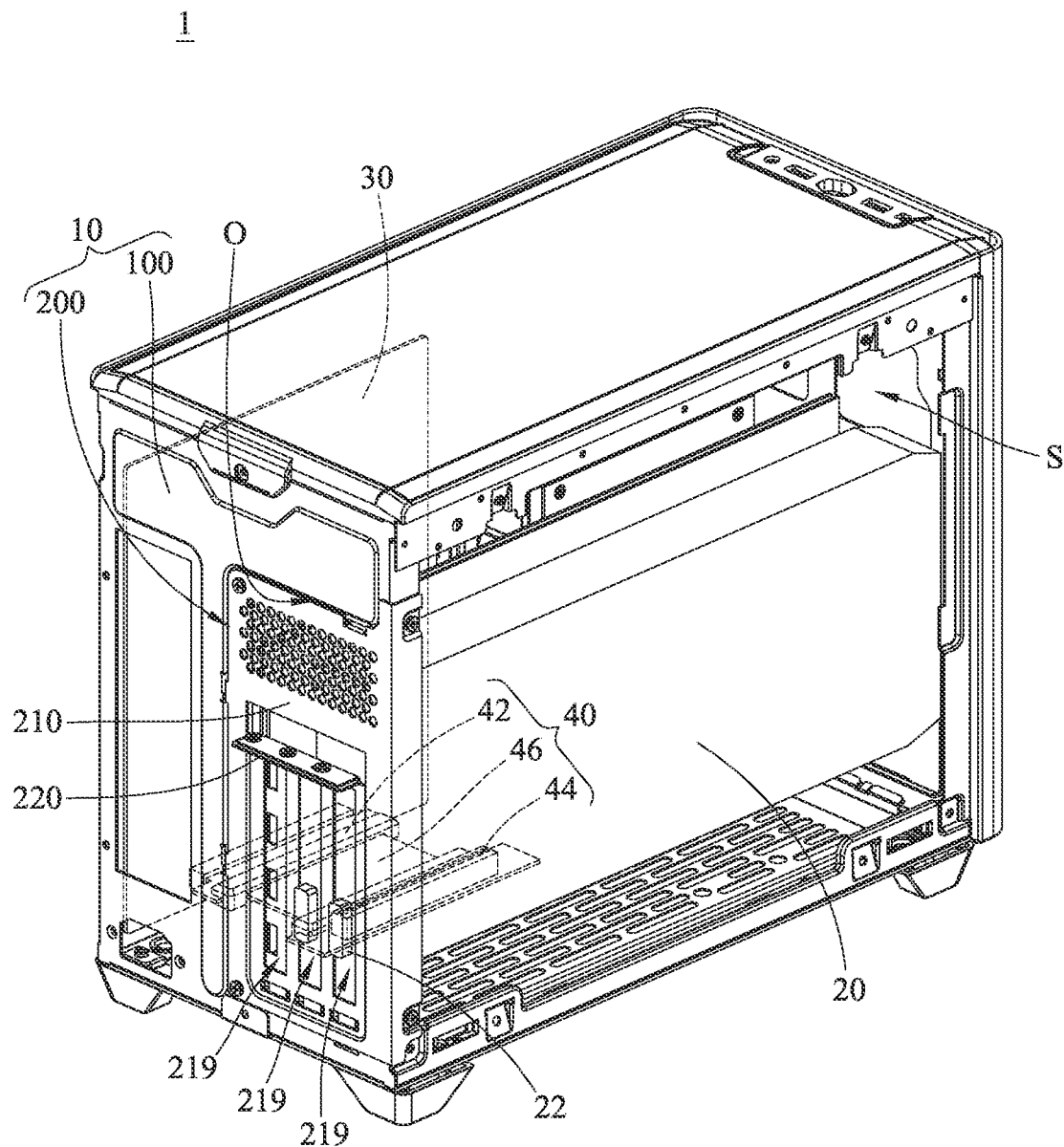
FIG. 1 is a perspective view of an electronic device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
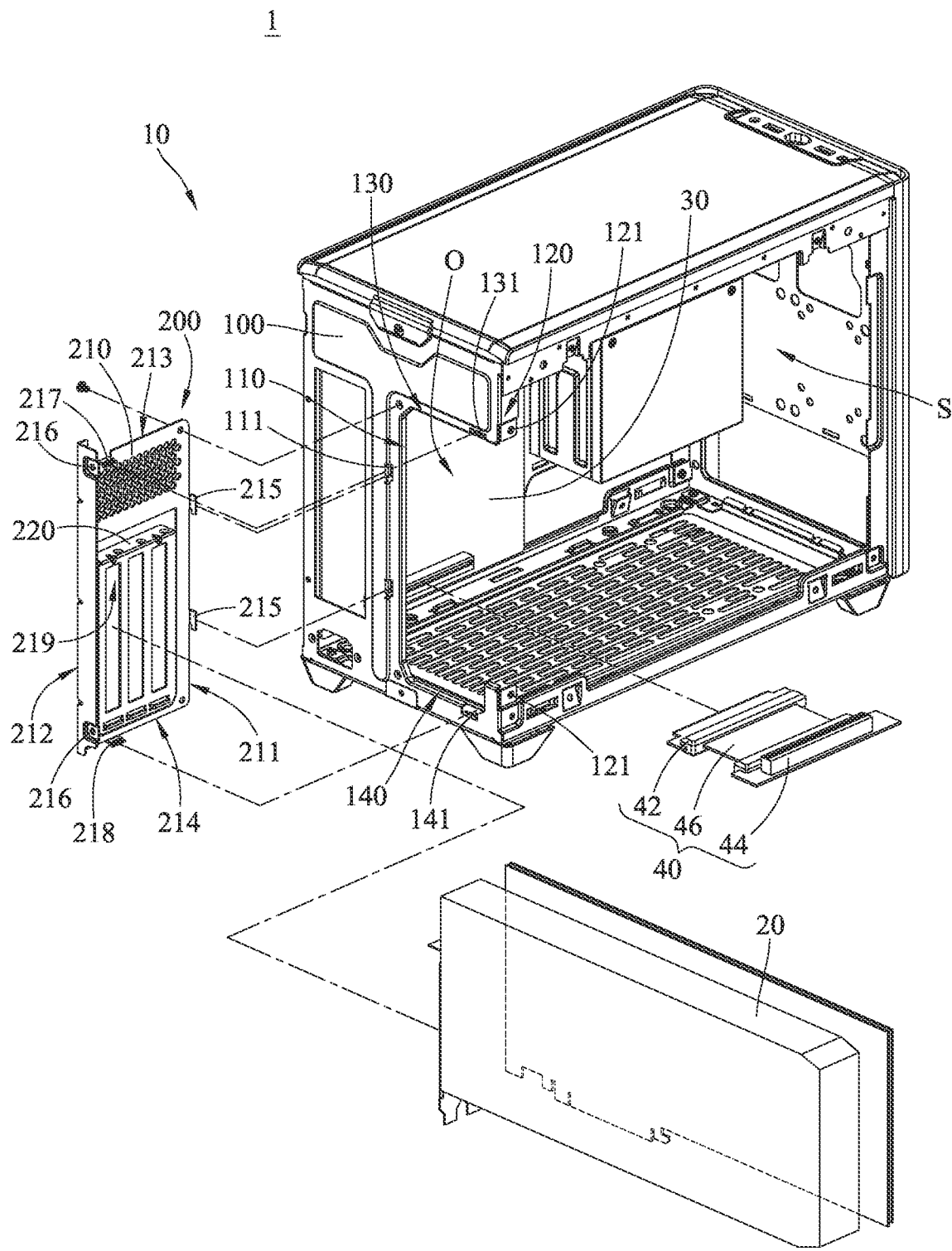
FIG. 2 is an exploded view of the electronic device in FIG. 1.

Referring to FIGS. 1 and 2, there are shown a perspective view and an exploded view of an electronic device 1 according to one embodiment of the disclosure.

In this embodiment, the electronic device 1 is, for example, a host of a desktop computer, a server, a barebone computer or the like. The electronic device 1 includes a casing 10 and an expansion card 20. The casing 10 includes a chassis 100 and an installation frame 200. The installation frame 200 is pivotably disposed on the chassis 100. In this embodiment, the electronic device 1 may, for example, further include a motherboard, random access memories, hard disk drives, a power supply, and so on, but some of them are omitted in the figures for clearly showing the main aspect of the disclosure.

Figure 6:
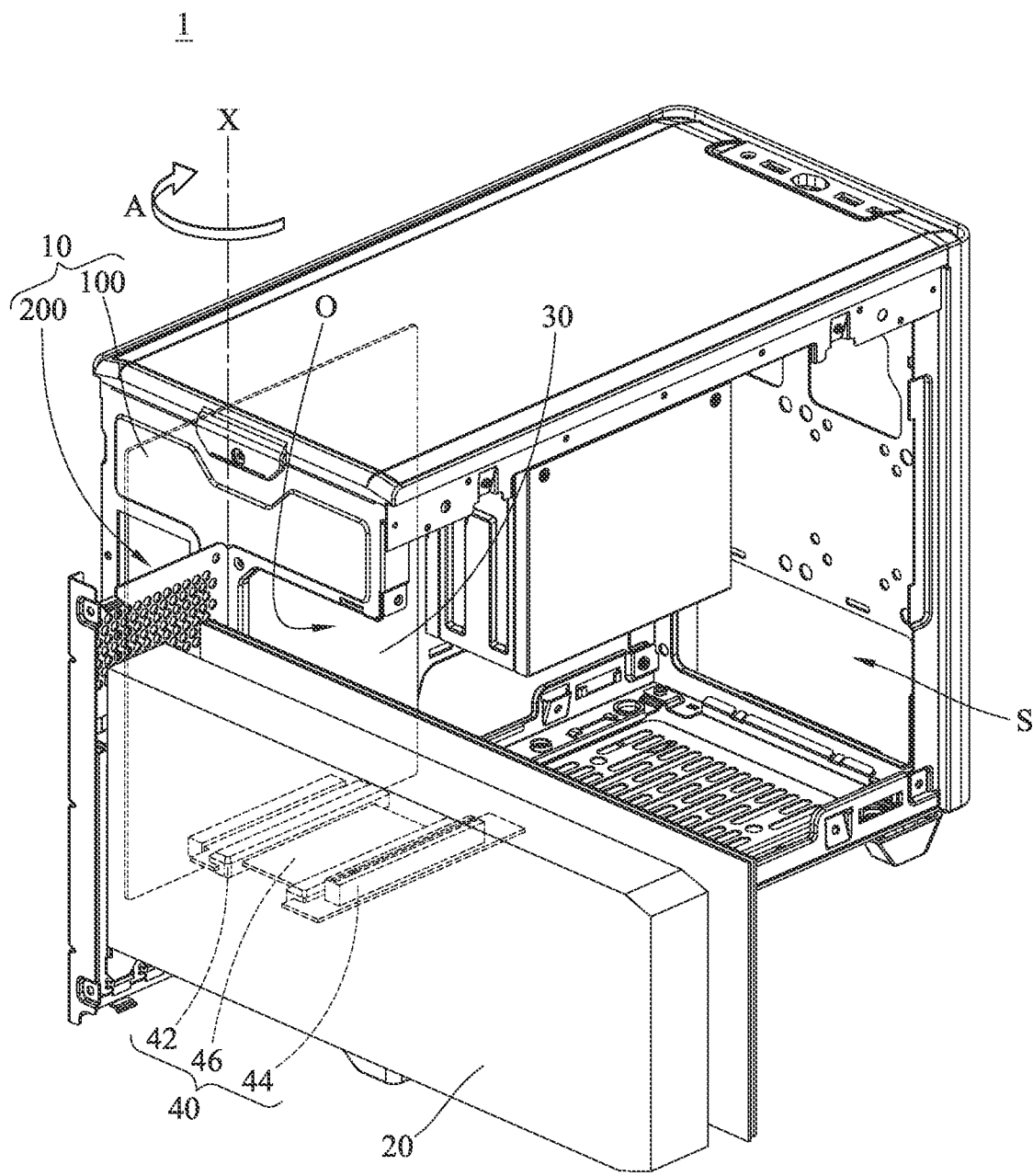
FIG. 6 is a perspective view of the electronic device in FIG. 1 when an installation frame is opened.

The chassis 100 is in a cuboid shape. The chassis 100 has an accommodation space S and an opening O. The opening O is connected to the accommodation space S, and the accommodation space S is connected to outside via the opening O. The expansion card 20 is, for example, a graphics card. The expansion card 20 is fixed to the installation frame 200. The expansion card 20 is movable along with the installation frame 200 so as to be located in the accommodation space S (as show in FIG. 1) or at least partially located outside the accommodation space S via the opening O (as shown in FIG. 6).

Note that the shape of the chassis 100 is not restricted and may be modified as required; in some other embodiments, the chassis may be in a hexagonal prism shape or a cylindrical shape.

Note that the type of the expansion card 20 is not restricted; in some other embodiments, the expansion card may be a sound card, a network interface card, or a card with another function.

In this embodiment, the electronic device 1 may further include a motherboard 30 and a signal adapter 40. The motherboard 30 is fixed to the chassis 100. The signal adapter 40 includes a first electrical connector 42, a second electrical connector 44, and a flexible connection wire 46.

The flexible connection wire 46 is, for example, a flat wire. The flexible connection wire 46 connects the first electrical connector 42 with the second electrical connector 44. The first electrical connector 42 is inserted into the motherboard 30. The second electrical connector 44 is inserted into the expansion card 20.

Figure 3:
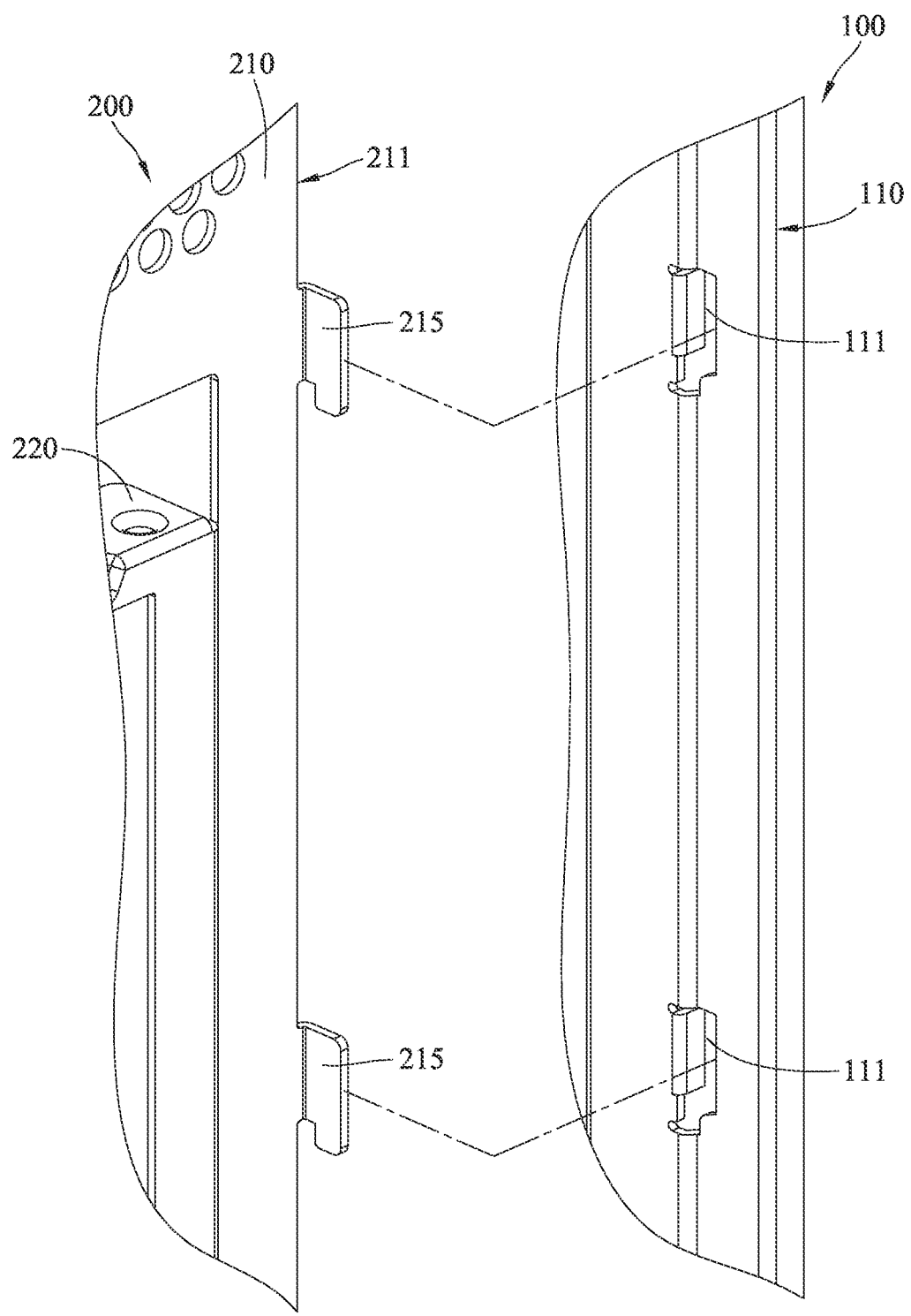
FIG. 3 is a partial and enlarged exploded view of the electronic device in FIG. 2.
Figure 4:
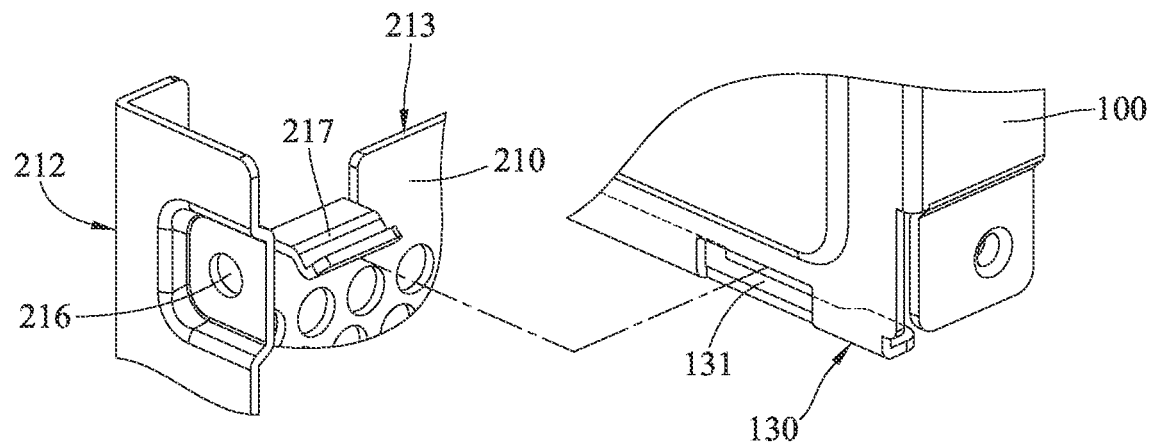
FIG. 4 is another partial and enlarged exploded view of the electronic device in FIG. 2.
Figure 5:
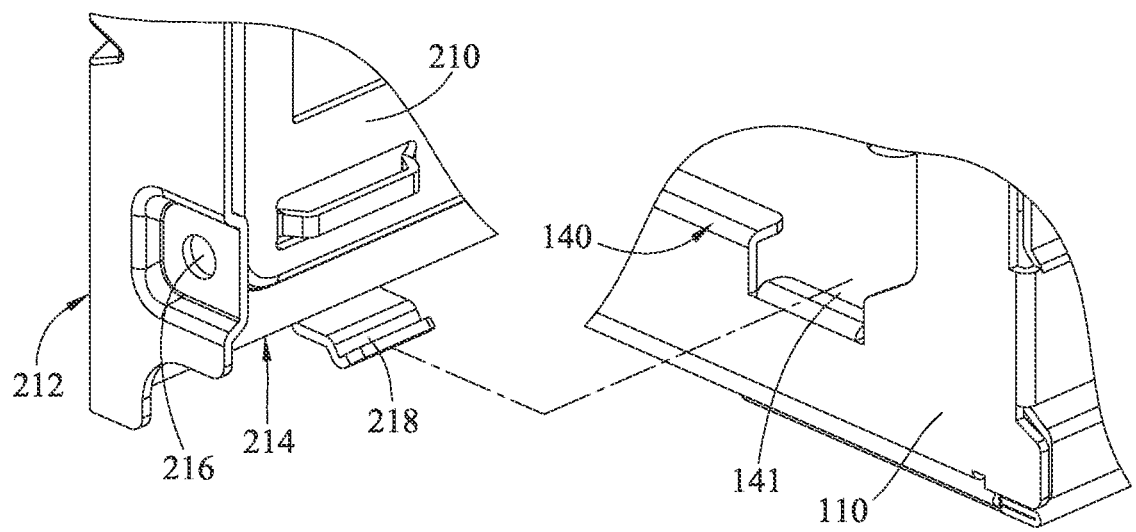
FIG. 5 is still another partial and enlarged exploded view of the electronic device in FIG. 2.

Referring to FIGS. 3 to 5, there are shown different partial and enlarged exploded views of the electronic device 1 in FIG. 2.

In this or another embodiment, the casing 10 has two first hinge structures 111. The installation frame 200 has two second hinge structures 215. The second hinge structures 215 are respectively disposed on the first hinge structures 111, such that the installation frame 200 is pivotably disposed on the chassis 100. For example, the chassis 100 has two first hinge structures 111 and two first mount structures 121 respectively located at a first side 110 and a second side 120 of the opening O located opposite to each other. The installation frame 200 includes a main portion 210 and a support portion 220. The main portion 210 has a first side 211 and a second side 212 located opposite to each other. The main portion 210 has two second hinge structures 215 located at the first side 211 of the main portion 210. The second hinge structures 215 are respectively disposed on the first hinge structures 111, such that the installation frame 200 is pivotably disposed on the chassis 100. The main portion 210 further has two second mount structures 216 located at the second side 212 of the main portion 210. The second mount structure 216 are respectively and detachably assembled with the first mount structures 121 so as to fix the expansion card 20 in the accommodation space S. The support portion 220 protrudes from the main portion 210 and is configured to support the expansion card 20. Moreover, when the support portion 220 of the installation frame 200 supports the expansion card 20, the expansion card 20 can be fixed to the support portion 220 via screws or other suitable fasteners, such that the expansion card 20 can be fixed to the installation frame 200.

In this or another embodiment, the first hinge structures 111 are through holes, and the second hinge structures 215 are hooks and are formed, for example, by bending the main portion 210. The hooks are respectively and detachably disposed through the through holes and hooked on the chassis 100, such that the installation frame 200 is pivotable relative to the chassis 100 via the cooperation of the hooks and through holes. That is, the installation frame 200 can be pivoted relative to the chassis 100 about an axis X.

Note that the types of the first hinge structures 111 and the second hinge structures 215 are not restricted and may be modified; in some other embodiments, the first hinge structures and the second hinge structures may be shaft holes and shafts mating with each other. In addition, the quantities of the first hinge structures 111 and the second hinge structures 215 are not restricted in this disclosure, and each of them may be modified to be one.

In this embodiment or another embodiment, the first mount structures 121 are, for example, screw holes, and the second mount structures 216 are, for example, through holes. The installation frame 200 can be fixed to the chassis 100 by fasteners, such as screws, which are respectively disposed through the second mount structures 216 and screwed into the first mount structures 121.

Note that the types of the first mount structures 121 and the second mount structures 216 are not restricted and may be modified as required; in some other embodiments, the first mount structures and the second mount structures may be recess structures and protrusion structures mating each other for fixing the installation frame to the chassis. In addition, the quantities of the first mount structures 121 and the second mount structures 216 are not restricted in this disclosure, and each of them may be modified to be one.

In this embodiment, the second hinge structures 215 are formed by bending the main portion 210, but the disclosure is not limited thereto; in some other embodiments, the second hinge structures may be connected to the main portion by a welding process.

In this or another embodiment, the chassis 100 further has two first engagement structures 131 and 141 respectively located at a third side 130 and a fourth side 140 of the opening O located opposite to each other, where the first engagement structures 131 and 141 are, for example, recess structures, and the third side 130 and the fourth side 140 of the opening O is located between the first side 110 and the second side 120 of the opening O. The main portion 210 has a third side 213 and a fourth side 214 located opposite to each other, where the third side 213 and the fourth side 214 are located between the first side 211 and the second side 212. The main portion 210 further has two second engagement structures 217 and 218 respectively located at the third side 213 and the fourth side 214 of the main portion 210. The second engagement structures 217 and 218 are, for example, elastic protrusions and may be formed by bending the main portion 210. That is, the second engagement structures 217 and 218 and the first engagement structures 131 and 141 are respectively the protrusion structures and the recess structures mating each other, and the second engagement structures 217 and 218 are respectively engaged with the first engagement structures 131 and 141. Therefore, the cooperation of the first engagement structures 131 and 141 and the second engagement structures 217 and 218 allow the installation frame 200 to temporarily maintain the expansion card 20 in the accommodation space S of the chassis 100.

In this or another embodiment, the main portion 210 has at least one opening 219. The opening 219 is configured to expose a connection port 22 of the expansion card 20, where the connection port 22 is an input/output port.

Referring to FIG. 6, there is shown a perspective view of the electronic device 1 in FIG. 1 when the installation frame 200 is opened. When the expansion card 20 is required to be removed from the casing 10, or components (e.g., a CPU or fans) in the chassis 100 are required to be maintained, the second electrical connector 44 of the signal adapter 40 can be detached from the expansion card 20, then the installation frame 200 is pivoted about the axis X (e.g., along a direction A) to open the accommodation space S of the chassis 100. By doing so, the expansion card 20 can be moved out of the accommodation space S of the chassis 100, such that there is sufficient room for a user to easily remove the expansion card 20 from the installation frame 200 or maintain the components in the chassis 100 easily without the interference of the expansion card 20. Therefore, it is convenient to maintain the components inside the casing 10 or the electronic device 1.

In contract, in a case that the installation frame 200 is open, after the expansion card 20 is installed on the installation frame 200, or the maintenances of the components in the chassis 100 are completed, the installation frame 200 can be pivoted reversely (e.g., along a direction opposite to the direction A) to move the expansion card 20 into the accommodation space S of the chassis 100, and then expansion card 20 is inserted into the second electrical connector 44 of the signal adapter 40.

According to the electronic device and the casing as described in the above embodiment, the expansion card is disposed on the installation frame which is pivotable relative to the chassis, such that when the expansion card is required to be removed from the casing, or components in the chassis are required to be maintained, the expansion card can be moved out of the accommodation space of the chassis by pivoting the installation frame. By doing so, there is sufficient room for a user to easily remove the expansion card from the installation frame or maintain the components in the chassis easily without the interference of the expansion card. Therefore, it is convenient to maintain the components inside the casing or the electronic device.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An electronic device, comprising:
a casing, comprising:
a chassis; and
an installation frame, pivotably disposed on the chassis; and
an expansion card, fixed to the installation frame;
wherein the chassis has an accommodation space and an opening, the opening is connected to the accommodation space, the expansion card is movable along with the installation frame so as to be located in the accommodation space or at least partially located outside the accommodation space through the opening;
wherein the chassis further has a first hinge structure and a first mount structure, the first hinge structure and the first mount structure are respectively located at a first side and a second side of the opening located opposite to each other, the installation frame comprises a main portion and a support portion, the main portion has a first side and a second side located opposite to each other, the main portion has a second hinge structure located at the first side of the main portion, the second hinge structure is disposed on the first hinge structure, such that the installation frame is pivotably disposed on the chassis, the main portion further has a second mount structure located at the second side of the main portion, the second mount structure is detachably assembled with the first mount structure so as to fix the expansion card in the accommodation space, and the support portion protrudes from the main portion and is configured to support the expansion card.

2. The electronic device according to claim 1, wherein the first hinge structure is a through hole, the second hinge structure is a hook, and the hook is detachably disposed through the through hole and hooked on the chassis.

3. The electronic device according to claim 2, wherein the second hinge structure is formed by bending the main portion.

4. The electronic device according to claim 1, wherein the first hinge structure and the second hinge structure are respectively a shaft hole and a shaft mating each other.

5. The electronic device according to claim 1, wherein the chassis further has two first engagement structures respectively located at a third side and a fourth side of the opening located opposite to each other, the third side and the fourth side of the opening are located between the first side and the second side of the opening, the main portion further has a third side and a fourth side located opposite to each other, the third side and the fourth side of the main portion is located between the first side and the second side of the main portion, the main portion further has two second engagement structures respectively located at the third side and the fourth side of the main portion, the first engagement structures and the second engagement structures are respectively recess structures and protrusion structures mating each other, and the second engagement structures are respectively engaged with the first engagement structures.

6. The electronic device according to claim 5, wherein the second engagement structures are formed by bending the main portion.

7. The electronic device according to claim 1, wherein the main portion has at least one opening, and the at least one opening of the main portion is configured to expose a connection port of the expansion card.

8. The electronic device according to claim 1, further comprising a motherboard and a signal adapter, wherein the signal adapter comprises a first electrical connector, a second electrical connector, and a flexible connection wire, the flexible connection wire connects the first electrical connector with the second electrical connector, the first electrical connector is inserted into the motherboard, and the second electrical connector is inserted into the expansion card.

9. A casing, configured for an installation of an expansion card, the casing comprising:
a chassis; and
an installation frame, pivotably disposed on the chassis and configured for the installation of the expansion card;
wherein the chassis has an accommodation space and an opening, the opening is connected to the accommodation space, the expansion card is movable along with the installation frame so as to be located in the accommodation space or at least partially located outside the accommodation space through the opening;
wherein the chassis further has a first hinge structure and a first mount structure, the first hinge structure and the first mount structure are respectively located at a first side and a second side of the opening located opposite to each other, the installation frame comprises a main portion and a support portion, the main portion has a first side and a second side located opposite to each other, the main portion has a second hinge structure located at the first side of the main portion, the second hinge structure is disposed on the first hinge structure, such that the installation frame is pivotably disposed on the chassis, the main portion further has a second mount structure located at the second side of the main portion, the second mount structure is detachably assembled with the first mount structure so as to fix the expansion card in the accommodation space, and the support portion protrudes from the main portion and is configured to support the expansion card.

10. The casing according to claim 9, wherein the first hinge structure is a through hole, the second hinge structure is a hook, and the hook is detachably disposed through the through hole and hooked on the chassis.

11. The casing according to claim 10, wherein the second hinge structure is formed by bending the main portion.

12. The casing according to claim 9, wherein the first hinge structure and the second hinge structure are respectively a shaft hole and a shaft mating each other.

13. The casing according to claim 9, wherein the chassis further has two first engagement structures respectively located at a third side and a fourth side of the opening located opposite to each other, the third side and the fourth side of the opening are located between the first side and the second side of the opening, the main portion further has a third side and a fourth side located opposite to each other, the third side and the fourth side of the main portion is located between the first side and the second side of the main portion, the main portion further has two second engagement structures respectively located at the third side and the fourth side of the main portion, the first engagement structures and the second engagement structures are respectively recess structures and protrusion structures mating each other, and the second engagement structures are respectively engaged with the first engagement structures.

14. The casing according to claim 13, wherein the second engagement structures are formed by bending the main portion.

15. The casing according to claim 9, wherein the main portion has at least one opening, and the at least one opening of the main portion is configured to expose a connection port of the expansion card.

\* \* \* \* \*